United States Patent
Lussenhop et al.

[11] Patent Number: 5,963,855
[45] Date of Patent: Oct. 5, 1999

[54] METHOD FOR EXTENDING THE RSSI RANGE AND RADIO TRANSCEIVER OPERATING IN ACCORDANCE WITH THIS METHOD

[75] Inventors: Peter Lussenhop, Hattingen, Germany; Risto Vaisanen, Salo, Finland

[73] Assignee: Nokia Mobile Phones Limited, Salo, Finland

[21] Appl. No.: 08/784,080

[22] Filed: Jan. 15, 1997

[30] Foreign Application Priority Data

Jan. 17, 1996 [EP] European Pat. Off. ............. 96100642

[51] Int. Cl.$^6$ .................................................. H04B 17/00
[52] U.S. Cl. .................. 455/226.2; 455/217; 455/226.1; 455/226.2; 455/230; 455/232.1; 455/234.1; 455/239.1; 455/245.1; 455/249.1; 455/250.1; 455/254
[58] Field of Search ................................ 455/217, 226.1, 455/226.2, 230, 232.1, 234.1, 239.1, 245.1, 249.1, 250.1, 254

[56] References Cited

U.S. PATENT DOCUMENTS

| | | | |
|---|---|---|---|
| 4,227,256 | 10/1980 | O'Keefe | 455/251 |
| 4,853,972 | 8/1989 | Ueda et al. | 455/254 |
| 5,212,834 | 5/1993 | Nuqvist | 455/311 |
| 5,230,096 | 7/1993 | Davies et al. | 455/217 |
| 5,257,411 | 10/1993 | Minasi | 455/80 |
| 5,304,948 | 4/1994 | Mucke | 330/284 |
| 5,307,026 | 4/1994 | Mucke | 330/283 |
| 5,335,362 | 8/1994 | Vaisanen et al. | 455/67.1 |
| 5,410,733 | 4/1995 | Niva et al. | 455/33.2 |
| 5,457,814 | 10/1995 | Myrskog et al. | 455/127 |
| 5,507,022 | 4/1996 | Uomoto | 455/226.2 |
| 5,513,387 | 4/1996 | Saito et al. | 455/249.1 |
| 5,566,201 | 10/1996 | Ostman | 375/200 |
| 5,630,221 | 5/1997 | Birleson | 455/250.1 |
| 5,722,060 | 2/1998 | Horigome | 455/234.1 |
| 5,732,342 | 3/1998 | Roth et al. | 455/234.1 |

FOREIGN PATENT DOCUMENTS

| | | | |
|---|---|---|---|
| 0 639 901 | 2/1995 | European Pat. Off. | |
| WO90/06021 | 11/1988 | WIPO | 455/239.1 |

*Primary Examiner*—Dwayne D. Bost
*Assistant Examiner*—Quochien B. Vuong
*Attorney, Agent, or Firm*—Perman & Green, LLP

[57] ABSTRACT

The present invention relates to the extension of the RSSI range of a radio transceiver, in which the RSS value is monitored continuously during reception by a limiter circuit (1). This extension is performed by switching into the operating state of attenuation components (3, 4) which are already present in the receive path of the radio transceiver and in addition to an attenuation function have at least one further function required for operating the radio transceiver. Furthermore, a method is specified by means of which the additional attenuation of such a component (3, 4) which can be switched over can be established and stored in the radio transceiver.

11 Claims, 5 Drawing Sheets

METHOD FOR EXTENDING THE RSSI RANGE AND RADIO TRANSCEIVER OPERATING IN ACCORDANCE WITH THIS METHOD

FIELD OF THE INVENTION

The invention relates to a method for extending the radio signal strength indicator range (designated below as RSSI range or RSS measuring range) of a radio transceiver, in which the RSS value (Radio Signal Strength value) is measured continuously during reception by measuring the signal level by means of a measuring device present in the receive path of the radio transceiver in such a way that given an RSS value larger than a predetermined upper RSS value an additional known attenuation is inserted into the receive path between the antenna and measuring device and all subsequent RSS values are determined by adding the known attenuation respectively to the measured signal level, while given an RSS value smaller than a predetermined lower RSS value the additional known attenuation is re-extracted from the receive path between the antenna and measuring device. The invention also relates to a radio transceiver having a device for extending the RSS measuring range and to a method for determining and storing the attenuation of a component which is present in the receive path of such a radio transceiver.

BACKGROUND OF THE INVENTION

The RSS level is a measure of the signal strength, present at the antenna, of an RF useful signal. All the radiotelephones, for example portable ones, have a defined range for the RF useful signal, in which they can operate with a tolerable error. The boundaries of this range are defined by specific RSS values. In order for the radiotelephone to be able to determine whether the received RF useful signal is still inside this range, the signal level thereof must be measured. If the measured signal strength is outside the defined range, the telephone automatically changes the channel and/or the base station.

A limiter circuit is used in conventional receiver structures in order to establish these boundaries. This permits a simple and cost-effective design in the receive path of the radiotelephone. A substantial disadvantage of the use of a limiter circuit is its narrow dynamic range. A typical range of the signal strength which can be measured directly using a limiter circuit is, for example, −100 dBm to −25 dBm.

If the radiotelephone has to operate near a base station, it is frequently necessary to raise the upper boundary of the RSSI range, for example to −10 dBm. However, this RSS value can no longer be measured directly by the limiter circuit. It is therefore customary to use a separate measuring device at a point in the receive path at which the signal has a lower level, or a known and separate attenuator is connected upstream of the limiter circuit. Such a connection can be performed, for example, via a PIN diode.

As a result of such a separate measurement of the signal level or as a result of the connection of a known and separate attenuator, however, the circuit arrangement becomes more complicated, the radiotelephone becomes more susceptible to error, and the design becomes more expensive.

OBJECTS OF THE INVENTION

It is therefore a first object of the invention to specify a method for extending the RSSI range of a radio transceiver by means of which the RSSI range can be extended as desired and a simple, cost-effective design, less susceptible to error, of a radio transceiver can be achieved.

Furthermore, a second object is to specify a radio transceiver having a device for extending the RSSI range which can be designed more simply and more cost-effectively and is more readily available.

Finally, it is a third object of the invention to specify a method which enables simple means to be used to mass produce radio transceivers in which the method in accordance with the first object is implemented and which are designed in accordance with the second object.

SUMMARY OF THE INVENTION

According to the invention, the above objects are achieved by using components which are already present in the receive path of the radio transceiver, can be switched into a plurality of operating states and are in the receive path between the antenna and the measuring device for measuring the signal level, instead of additional connectable attenuators. If additional attenuation is required to extend the RSSI range, at least one of these components is changed to an operating state in which it has a higher attenuation.

In order for the respective extension of the RSSI range to be known, a method is used to determine and store the attenuation value of such a component having a plurality of functions.

Overall, a method is specified by means of which the RSSI range can be extended as desired, and by means of which a simple, cost-effective design, less susceptible to error, of a radio transceiver is achieved. Furthermore, a radio transceiver having these properties has been specified. Finally, a method is specified by means of which the attenuation of a component which can be switched into a plurality of operating states and which is in the receive path between the antenna and the measuring device can be measured in the operating state of attenuation and can be stored in the radio transceiver. Such a measurement and storage of the attenuation renders possible the mass production of radio transceivers which operate in accordance with the invention.

The advantage of the method and of the device according to the invention resides in that no additional components such as, for example, an additional switchable attenuator or an additional measuring device in the radio transceiver are required, and that in order to measure the signal strength level use can be made of the known limiter circuits, which can be installed simply and cost-effectively, even over an extended RSSI range.

A preferred application of the invention is in radiotelephones, for example digital mobile telephones (handys) or cordless digital telephones, and mobile fax machines.

As already described above, an advantageous embodiment of the invention consists in that it is possible to use as measuring device a limiter circuit which measures the signal level in the demodulator path of the radio transceiver. If such a limiter circuit is used, it is very easy to fix a predetermined upper or lower RSS value which form the RSSI range in which the radio transceiver operates with a tolerable error. If this range is to be extended, an additional known attenuation is inserted into the receive path between the antenna and limiter circuit, starting from an RSS value which is greater than the predetermined upper RSS value. This predetermined upper RSS value can easily be established by the limiter circuit and can, for example, be −25 dBm. If the signal level drops below a predetermined lower RSS value, the additional known attenuation is re-extracted from the receive path between the antenna and limiter circuit. The limiter circuit can also easily establish the predetermined lower RSS value, which is −100 dBm, for example. The connection and disconnection of an additional known attenuation can also be performed in stages by the possibility of optionally connecting and disconnecting a plurality of additional known attenuations.

If the RSS value is to be outside the extended RSSI range, the radio transceiver is caused to change the channel and/or the base station.

Further particularly advantageous embodiments of the invention consist in that an amplifier, an antenna changeover switch between the transmit path (Tx) and receive path (Rx) or an antenna changeover switch between the internal antenna and additional antenna (for example car antenna, external) can be used as components which are already present in the receive path and in addition to an attenuation function have at least one further function required for operating the radio transceiver. These components are respectively used in their normal function, and if the RSSI range is to be extended they are switched over into an operating state in which they have a higher attenuation than in the normal operating state. Owing to the use according to the invention of already present components which have a different known attenuation in different operating states, it is possible to dispense with the separate installation of an additional attenuator. Thus, for example, the amplifier can easily be switched off so that it has a higher attenuation than in its normal amplifying operating state. An antenna changeover switch can be switched over simply for this purpose in each case. The basic precondition for switching over these components is that they can be switched over or off electrically or electronically. However, this precondition is obtained for the corresponding components of a radio-telephone or of a fax machine.

According to the invention, the requirement of being able to determine the attenuation of the components which are already present in the corresponding radio transceiver and which can be switched over into the operating state of attenuation in the receive path upstream of the measuring device for the purpose of measuring the signal level produces a method having the following steps:

a) connecting the radio transceiver to a radio-frequency source having a predetermined output signal in conjunction with a possible receive frequency of the radio transceiver,
b) changing the component into an operating state in which it has no attenuation,
c) measuring the signal level by means of a measuring device present in the radio transceiver,
d) storing the measured signal level as a value RF1,
e) switching over the component into the operating state of attenuation,
f) remeasuring the signal level by means of the measuring device,
g) storing the remeasured signal level as a value RF2,
h) calculating the difference X between the measured and remeasured signal levels as X=RF1−RF2, and
i) storing the difference X in the radio transceiver.

This determination and storage of the attenuation of a component, coming into consideration for extending the RSSI range, of a radio transceiver renders known in the latter the difference in attenuation of the respective component and thus the possible extension of the RSSI range.

Again, in this method it is possible to use as radio transceiver a radiotelephone, for example a portable one, or a fax machine.

It is characterized, furthermore, in that the signal level is measured by a limiter circuit in the demodulator path of the radio transceiver.

According to another advantageous aspect, such a method is characterized in that an amplifier is switched off as the component present in the receive path and is thus switched over into the operating state of attenuation.

Yet another advantageous aspect in such a method is characterized in that the connection between the antenna and the receive path is interrupted by means of an antenna changeover switch present in the receive path, and the antenna switch is thus switched over into the operating state of attenuation.

BRIEF DESCRIPTION OF THE INVENTION

This and other features, characteristics, aspects and advantages of the present invention are illustrated in the following detailed description in conjunction with the attached drawings, in which:

FIG. 1 shows the receive path of a prior art radio transceiver having a limiter circuit and an additional attenuator DG, FIG. 2 shows a design according to the invention of a receive path in a mobile telephone, FIG. 3 shows a further design according to the invention of a receive path in a mobile telephone, FIG. 4 shows a flow diagram by means of which the method for extending the RSSI range of a radio transceiver is explained, FIG. 5 shows a still further design according to the invention of a receive path in a mobile telephone, FIG. 6 shows the design of a receive path in which the attenuation of a component present in this receive path is to be determined and stored, FIG. 7 shows a flow diagram for explaining the method for determining and storing the attenuation of the component in the design according to FIG. 6, and FIG. 8 shows a still other design according to the invention.

DETAILED DESCRIPTION OF THE INVENTION

Figure 1:
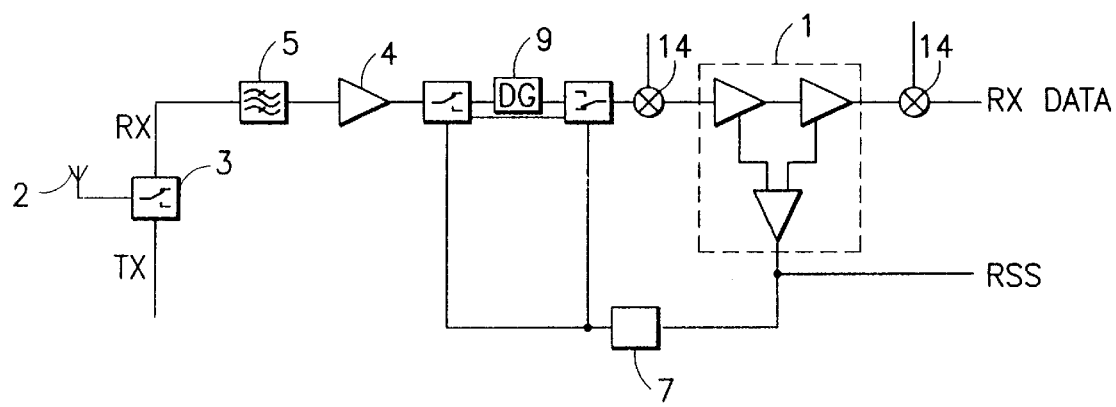

FIG. 1 shows a prior art which is relevant to this invention with reference to the example of a cordless telephone. The receive path of the telephone is represented up to the limiter circuit. The signal received by the antenna 2 passes to an amplifier 4 via an antenna changeover switch 3 and a filter 5. Downstream or this amplifier 4, between the mixers 14 of the receive path, there is a limiter circuit 1 for measuring the RSS value. Within a specific RSSI range (for example −100 dBm to −25 dBm), the limiter circuit 1 can measure the RSS value directly. The design of such a limiter circuit 1 is generally known and is not to be further described here. If an RSS value is higher than the upper boundary of this range, it can no longer be measured directly by the limiter circuit 1. In order that it can be determined nevertheless, a microcomputer 7 interposes an attenuator 9 into the signal path upstream of the limiter circuit 1. The attenuation of this attenuator is known. The limiter circuit 1 now measures a signal level which is less by the interposed attenuation. If this level is within the range which can be measured directly by the limiter circuit 1 (for example −100 dBm to −25 dBm), the RSS value can be calculated by adding the known attenuation value of the interposed attenuator to the measured signal level. If the signal level measured by the limiter circuit 1 drops below the lower boundary of the range which can be measured directly by the limiter circuit 1, the interposed attenuator is again removed from the signal path and the RSS value can again be measured directly by the limiter circuit 1. If the measured signal level is above the upper boundary despite the interposition of the attenuator, or below the lower boundary despite the removal of the attenuator, the channel and/or the base station are changed. Thus, the signal level of the signal arriving at the antenna 2 is measured by means of a limiter circuit 1 in the receive path. If a specific upper signal level is measured by the limiter circuit 1, the microcomputer 7 switches an attenuator 9 into the receive path upstream of the limiter circuit 1. The limiter circuit 1 can measure an extended RSSI range by this method. The components in the receive path between the antenna 2 and the limiter circuit 1, such as the antenna switch 3, the filter 5 or the amplifier 4, remain during this measurement in their normal operating state for receiving received data.

FIGS. 2 to 5 show the receive paths of different realizations of radio transceivers according to the invention, and a block diagram for the purpose of explaining the method for extending the RSSI range (Radio Signal Strength measuring range) according to the invention. The devices according to the invention differ from the authoritative prior art to the extent that given an identical measuring device (a limiter circuit is used here as well) there is no need for an additional attenuator 9 for extending the measuring range or extending the RSSI range in the receive path. The switching and functioning of the limiter circuit and of the microcomputer are identical to the described prior art. The invention consists in that there is no interposition of a known attenuator for the purpose of extending the measuring range, but rather the state of components already required for the functioning of the radio transceiver is switched over. This switching over is performed by the microcomputer. In order to explain the inventive concept, the control line normally present in devices of this type for the relevant component has been illustrated at in each case one of the components present in the receive path between the antenna 2 and the limiter circuit 1. Depending on the state of the limiter circuit 1, this control line is used to switch the relevant component, via the microcomputer (not represented), into the normal operating state, in which it has no attenuation, or into the operating state of attenuation. Thus, no additional subassemblies are required here to extend the RSSI range, as is the case according to the prior art.

Figure 2:
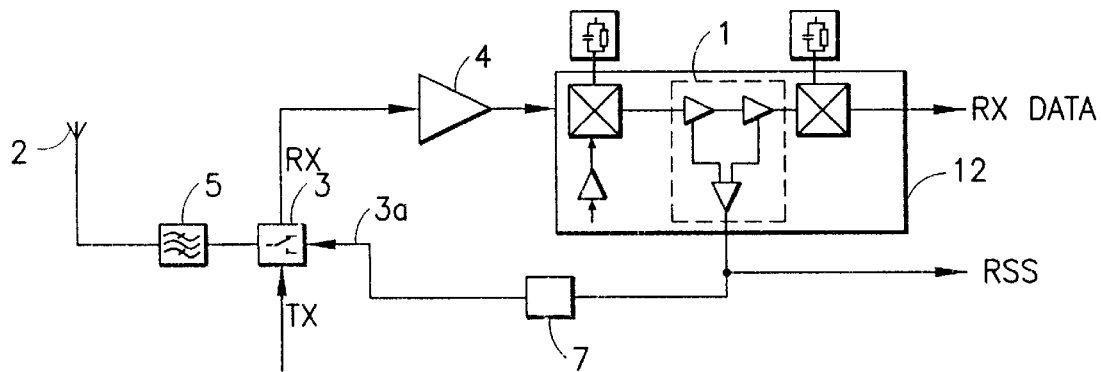

FIG. 2 shows a design according to the invention of a receive path in a mobile telephone. This is a cordless telephone having an antenna changeover switch 3 for changing over the antenna between the receive path RX and the transmit path TX (not represented in more detail) of the telephone. A received signal passes via the antenna 2 and the filter 5 (bandpass filter) to the antenna changeover switch 3. From there, it passes via the amplifier 4 to the demodulator IC 12. The limiter circuit 1 is located in the demodulator IC 12, in the signal path of the receive path. A control signal line leads from the limiter circuit 1 to the microcomputer 7, which via a further signal line 3a can switch over the antenna changeover switch 3 as a function of a control signal received via the control signal line.

Figure 3:
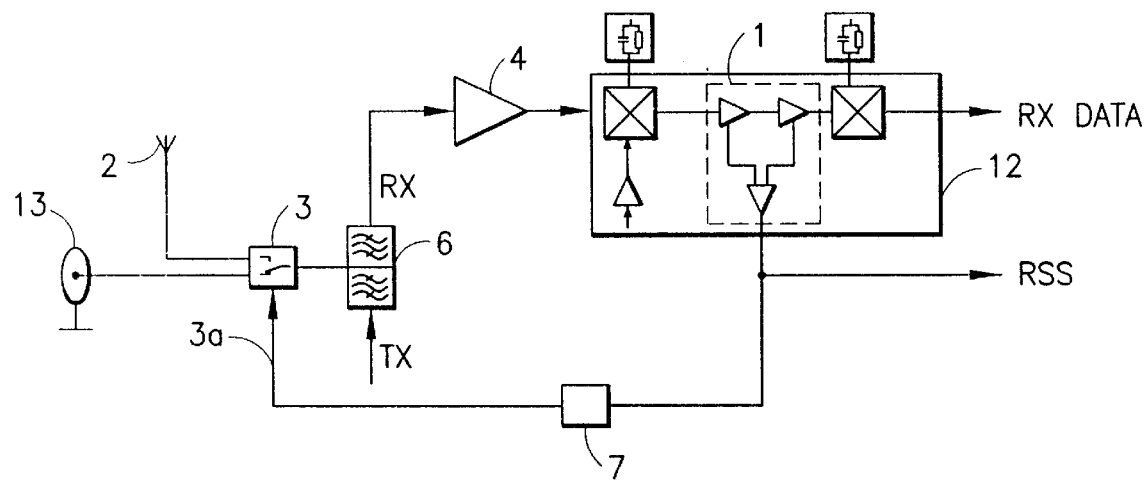

FIG. 3 shows a further design according to the invention of a receive path in a mobile telephone. This is a radiotelephone in which an antenna changeover switch 3 can change over between an internal antenna 2 and a socket 13 for external antennas. A received signal passes via the internal antenna 2 or the socket 13 for external antennas to the antenna changeover switch 3. From there, it passes via a duplexer 6 into the receive path RX and thus to an amplifier 4. From there, the received signal passes to the demodulator IC 12, in which a limiter circuit 1 is again present in the signal path of the receive path. A control signal line leads from the limiter circuit 1 to a microcomputer 7, from which a further signal line 3a leads to the antenna changeover switch 3.

Figure 5:
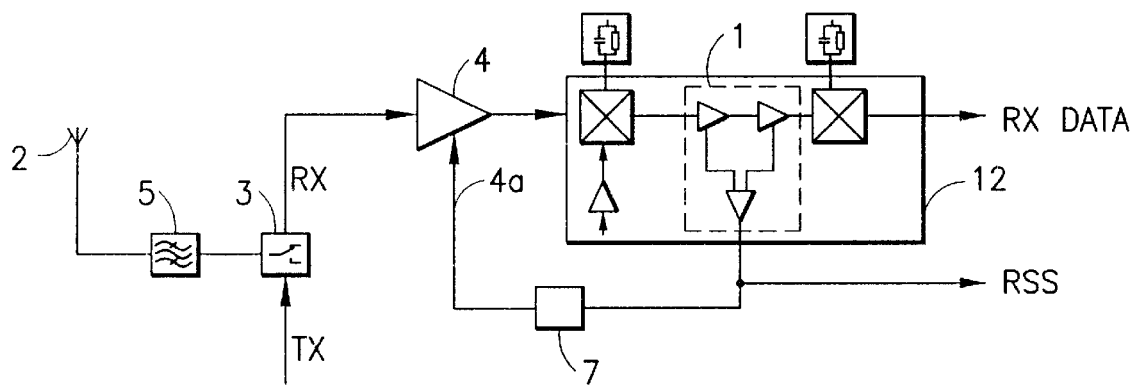

FIG. 5 shows yet a further design according to the invention of a receive path in a mobile telephone. This again is a cordless telephone. The difference from FIG. 2 consists in that a control signal line 4a leads from the microcomputer 7 to the amplifier 4.

In these designs according to the invention, the limiter circuit operates such that amplifiers operating in saturation/compression raise the input signal to a fixed value independently of the amplitude, since an amplitude which is as constant as possible is desired during the further demodulation of the received signal. The signal is limited for this reason, that is to say amplified as far as possible by means of the amplifiers. The amplifiers are thus in saturation (compression). A constant output amplitude of the signal is thus achieved for an arbitrary input amplitude Ui (for example −100 to −20 dBm).

Figure 4:
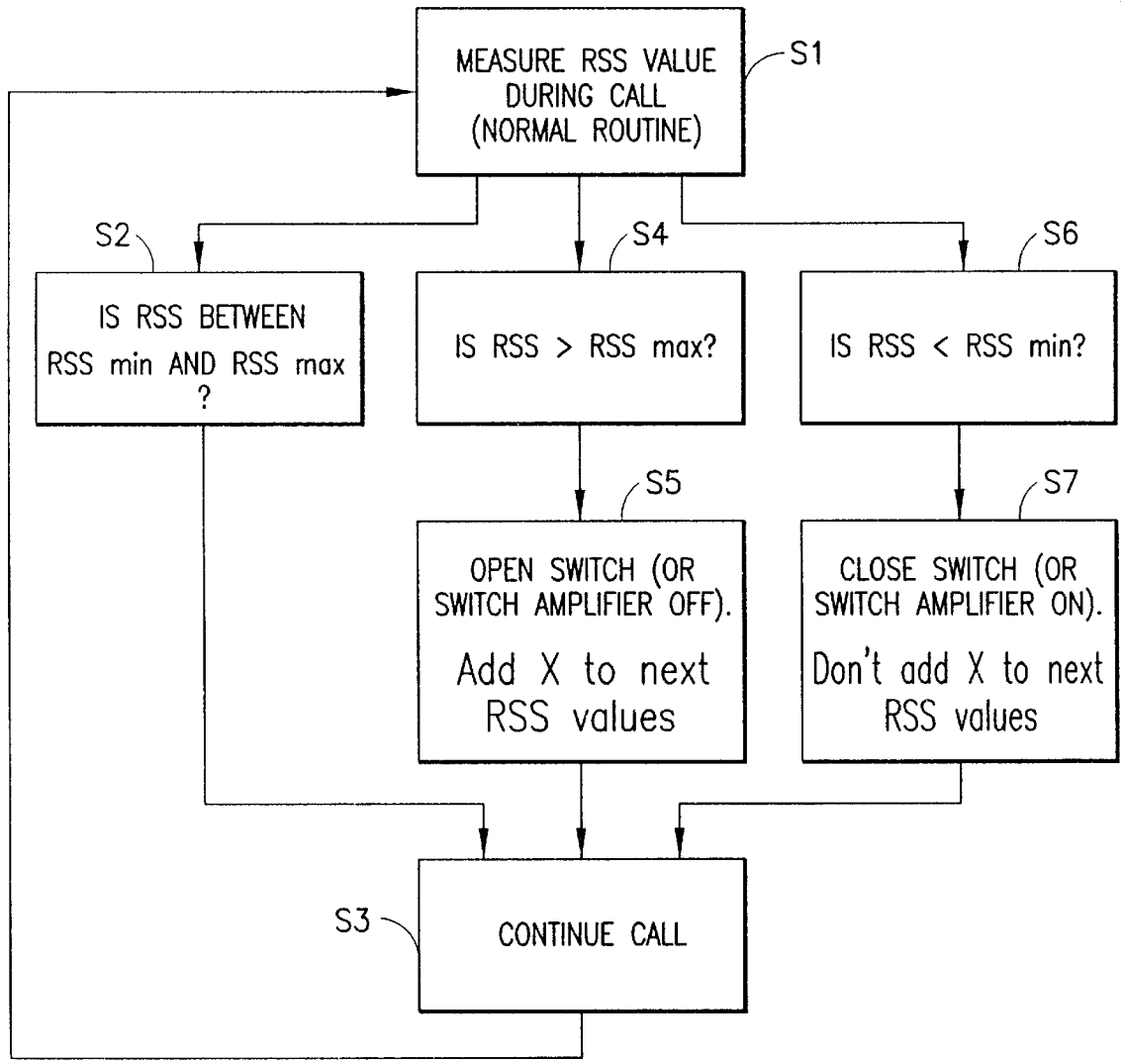

FIG. 4 shows the flow diagram representing the method for extending the RSSI range in the case of a telephone call. It is established during the call whether the signal level is presently inside the normal measurable RSSI range, above it or below it. If it is above it, the RSSI range is extended, for example by opening the antenna switch or by switching off the amplifier. If it is below it, the extension is cancelled again by reclosing the switch or by reconnecting the amplifier. Thereafter, the telephone call is continued as normal. In order to calculate the correct RSS value from a measured signal level, the respective attenuation value must be added to the signal level with attenuation inserted (open switch or amplifier switched off). The diagram represents only this extension of the RSSI range. It is not shown that the radiotelephone must change the channel and/or the base station when it is no longer possible to extend the measuring range and the measured signal strength is nevertheless higher than the predetermined maximum signal level, or when it is no longer possible to cancel the extension of the RSSI range because no additional attenuation is inserted and the measured signal level is nevertheless lower than a predetermined lower RSS value.

The RSS value is measured during a telephone call in step S1. Thereafter, it is established in step S2 whether the RSS value is between a lower and an upper RSS value. If this condition is obtained, the telephone call is continued in step S3 and the routine passes again into step S1. Simultaneously with step S2, it is checked in step S4 whether the measured RSS value is higher than the upper RSS value. If this is the case, the antenna changeover switch 3 is opened in step S5 (or the amplifier 4 is switched off). It is now also stipulated that in order to determine the RSS value the additional attenuation value X must be added to all the signal strength values subsequently measured. Thereafter, the call is continued in step S3, whereupon the routine again reaches step S1. Parallel to steps S2 and S4, it is checked in step S6 whether the measured RSS value is less than the lower RSS value. If this is the case, the antenna changeover switch 3 is reclosed in step S7 (or the amplifier 4 is switched on again). It is now stipulated that it is no longer necessary for the purpose of determining the RSS value to add the additional attenuation X to the subsequently measured signal strength values. Thereupon, the call is continued in step S3, and the procedure passes again into step S1.

Figure 6:
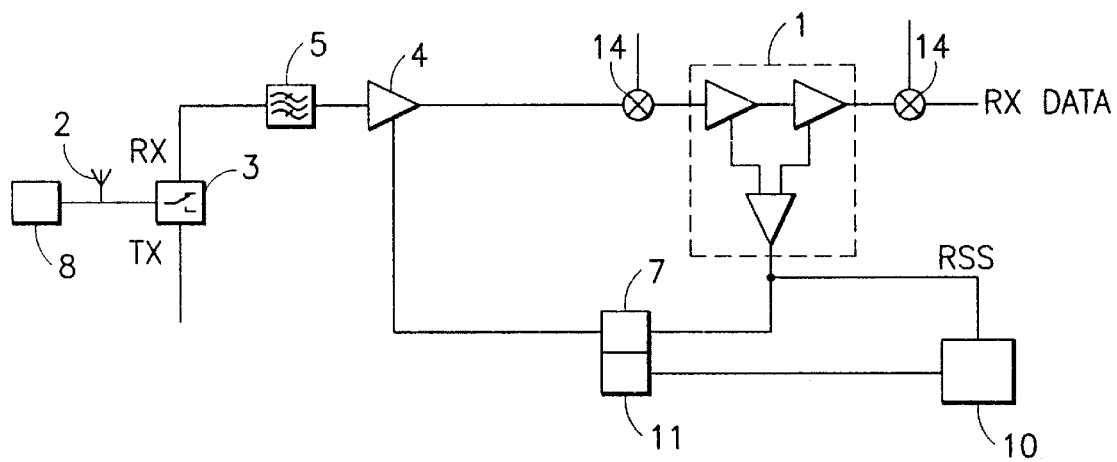

FIG. 6 shows a circuit arrangement for determining and storing the attenuation of a component which is present in the receive path of a radio transceiver and in addition to an attenuation function has at least one further function required for operating the radio transceiver. In addition to the known design of the receive path of the radio transceiver from FIG. 5, a measuring computer 10 is connected here to the output of the limiter circuit and to the memory 11 of the microcomputer 7. Furthermore, a radio-frequency source 8 has also been connected to the antenna 2.

Figure 7:
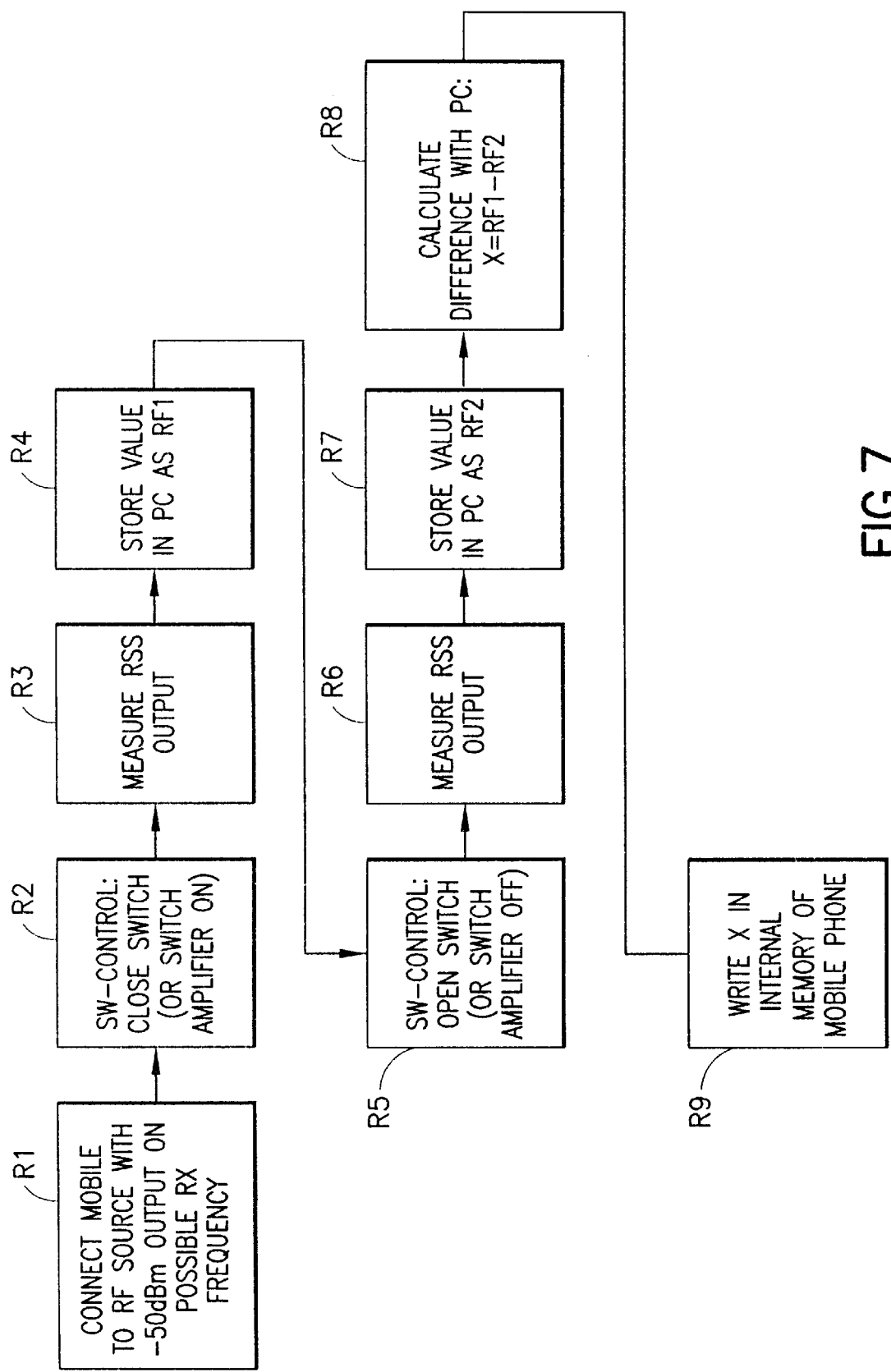

FIG. 7 shows a flow diagram which explains the method for determining and storing by means of a measuring arrangement according to FIG. 6 the attenuation of a component which is present in the receive path of a radio transceiver and in addition to an attenuation function has at least one further function required for operating the radio transceiver. This method renders possible the mass production of radio transceivers having the extension according to the invention of the RSSI range which can be measured by a limiter circuit. Since no attenuator having a known attenuation which is specified with a certain tolerance is switched into the signal path, the additional attenuation value of a component under consideration for the attenuation must be measured in each case in the operating state of attenuation of said component. In order for this attenuation value to be known in the radio transceiver, it is stored in the memory of the microcomputer. If it is possible to specify this attenuation value within tolerable error limits for the specific components, it is possible to dispense with this individual measurement, and the known attenuation values are stored according to the customary method during production.

In step R1, the radio transceiver is connected to a radio-frequency source 8 having a −50 dBm output signal for a possible receive frequency of the radio transceiver. Thereafter, in step R2 the microcomputer 7 is used to switch the antenna changeover switch 3 in such a way that the antenna is connected to the receive path RX of the radio transceiver. There is also the possibility that the amplifier 4 is switched on in this step. Thereafter, in step R3 the signal level is measured by the limiter circuit 1. Said signal level is stored in step R4 in the external measuring computer 10 as a value RF1. In step R5, the microcomputer 7 is used to switch over the antenna changeover switch 3, or to switch off the amplifier 4. The signal strength is again measured by the limiter circuit 1 in step R6. This is stored in the external measuring computer 10 as a value RF2 in step R7. In step R8, the difference X=RF1−RF2 is calculated by the external measuring computer 10. Finally, in step R9 the value X is stored in the internal memory 11 of the microcomputer 7 of the radio transceiver.

The invention is not limited to the exemplary embodiments explained; numerous variations and modifications are conceivable within the scope of the teaching according to the invention.

Figure 8:
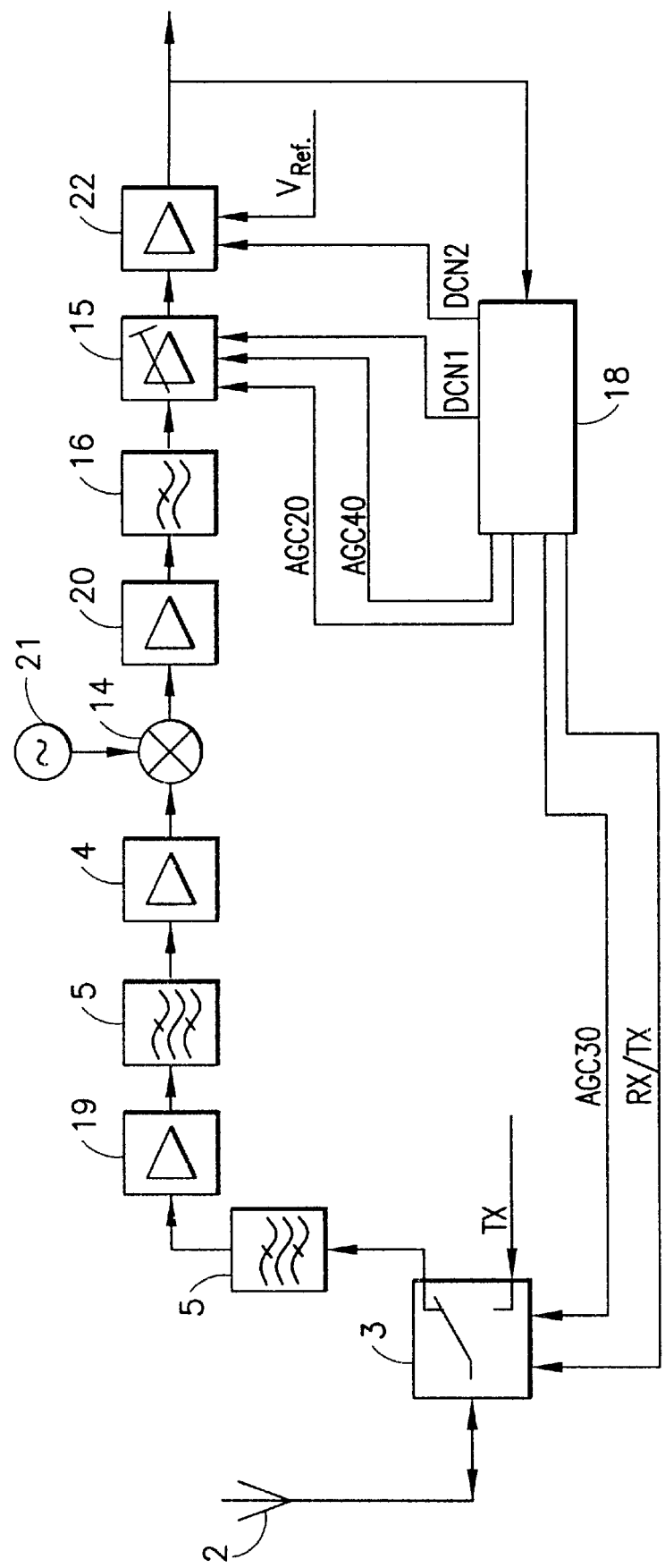

FIG. 8 shows the block diagram for another embodiment of the invention. It is based on a direct conversion receiver which does not use intermediate frequencies for downconversion of the received signal.

In difference to receivers with intermediate frequencies it is not possible to measure the Radio Signal Strength (RSS) of the intermediate frequency in the receiving path of a direct conversion receiver which does not have intermediate frequency stages, but downconverts the received radio signal directly to baseband with the mixer 14. In direct conversion receiver RSS is measured as the level of the signal converted to baseband.

The received RF signal from the antenna 2 is fed via an antenna changeover switch 3 and a filter 5 to the receiver unit.

The filtered RF signal is amplified and downconverted by the receiver part to the baseband. The RF-signal is filtered by the filters 5 and amplified by Low Noise Amplifiers (LNA) 19 and downconverted to baseband by mixer 14. The local signal for the mixer 14 is generated from a synthesizer 21 which is generally known and is not further described here. (This point ahead the received signal is is divided to I and Q signals).

The baseband signals are I and Q amplified by the differential-to-single-stage amplifier 20 and then filtered by the lowpass filter 16. The gain of the AGC amplifier 15 is controlled by the lines AGC20 and AGC40 from the AGC control unit 18.

The AGC control unit 18 may comprise a microprocessor, digital signal processing means, memory, software, A/D and D/A converters, timing circuits and input/output ports. The control signals AGC20, AGC30 and AGC 40 are generated by the AGC control unit 18 based on the results of the level measured from the received signal after amplifier 22.

When the lines AGC20, and AGC40 are inactive, the gain of amplifier 15 is 0 dB, when AGC20 is active and AGC40 is inactive the gain is 20 dB, when both lines are active the gain of amplifier 15 is 40 dB. Amplifier 15 and the following amplifier stage 22 contain also a necessary DC-offset compensation circuit. The compensation is made by DC offset compensation means included in the AGC control unit, controlled by the signals DCN1 and DCN2.

One AGC step is carried out in the RF-section of the direct conversion receiver to reduce the gain of the high frequency amplifier to avoid too high signal levels in strong field conditions.

The signal AGC30 from the AGC control unit 18 is used to control the antenna changeover switch 3 instead of controlling gain of first LNA 19 for instance by switching off the supply voltage of the LNA 19. By opening switch 3 during the receiving period the gain of receiving path is reduced typically 20–30 dB.

The advantage of this method is that espacially in direct conversion receivers the input impedance and output impedance of the LNA 19 remains unchanged when attenuation at this stage is needed. Modifying the gain of first LNA by AGC, as is known in prior art, changes drastically input and output impedances of the LNA 19, this is seen as a mismatch for mixer 14. This mismatch causes higher unwanted DC offset into the output of mixer 14.

What is claimed is:

1. Method for extending the RSSI range (Radio Signal Strength Indicator Range) of a radio transceiver, in which the RSS value is measured continuously during reception by measuring the signal level by means of a measuring device (1) present in the receive path of the radio transceiver in such a way that given an RSS value larger than a predetermined upper RSS value an additional known attenuation is inserted into the receive path between the antenna (2) and measuring device (1) and all subsequent RSS values are determined by adding the known attenuation respectively to the measured signal level, and given an RSS value smaller than a predetermined lower RSS value the additional known attenuation is re-extracted from the receive path between the antenna (2) and measuring device (1), characterized in that the additional known attenuation is provided by changing into an operating state of attenuation at least one component (3; 4) which is already present in the receive path and in addition to an attenuation function has at least one further function required for operating the radio transceiver; further characterized in that an amplifier (4) is switched off as the component present in the receive path and is thus changed into the operating state of attenuation.

2. Method according to claim 1, characterized in that a portable radiotelephone is used as the radio transceiver.

3. Method according to claim 1, characterized in that a fax machine is used as the radio transceiver.

4. Method according to claim 1, characterized in that the signal level is measured by a limiter circuit (1) in the demodulator path of the radio transceiver.

5. Method according to claim 1, characterized in that the connection between the antenna (2) and the receive path is interrupted by means of an antenna changeover switch (3) present in the receive path, and the antenna changeover switch (3) is thus changed into the operating state of attenuation.

6. Radio transceiver having a device (7) for extending the RSSI range (Radio Signal Strength Indicator Range), in which the RSS value is measured continuously during reception by measuring the signal level by means of a measuring device (1) present in the receive path of the radio transceiver, characterized in that it is possible to switch over into the operating state of attenuation at least one component (3; 4) which is already present in the receive path and in addition to an attenuation function has at least one further function required for operating the radio transceiver; further characterized in that the component which is present in the receive path is an amplifier (4) which can be switched on and off.

7. Device according to claim 6, characterized in that the radio transceiver is a portable radiotelephone.

8. Device according to claim 6, characterized in that the radio transceiver is a fax machine.

9. Device according to claim 6, characterized in that the measuring device is a limiter circuit (1).

10. Device according to claim 6, characterized in that the component which is present in the receive path is an antenna changeover switch (3) by means of which the connection between the antenna (2) and the receive path can be interrupted.

11. Method for determining and storing the attenuation of a component which is present in the receive path of a radio transceiver and in addition to an attenuation function has at least one further function required for operating the radio transceiver, having the following steps:

a) connecting the radio transceiver to a radio-frequency source (8) having a predetermined output signal in conjunction with a possible receive frequency of the radio transceiver, b) changing the component (3; 4) into an operating state in which it has no attenuation, c) measuring the signal level by means of a measuring device (1) present in the radio transceiver, d) storing the measured signal level (RF1), e) switching over the component into the operating state of attenuation, f) remeasuring the signal level by means of the measuring device (1), g) storing the remeasured signal level (RF2), h) calculating the difference (X=RF1−RF2) between the measured and remeasured signal levels, and i) storing the difference (X) in the radio transceiver.

* * * * *